United States Patent
Kim et al.

(10) Patent No.: US 7,224,616 B2
(45) Date of Patent: May 29, 2007

(54) CIRCUIT AND METHOD FOR GENERATING WORDLINE VOLTAGE IN NONVOLATILE SEMICONDUCTOR MEMORY DEVICE

(75) Inventors: Woo-Il Kim, Seoul (KR); Hui-Kwon Seo, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 71 days.

(21) Appl. No.: 11/166,620

(22) Filed: Jun. 24, 2005

(65) Prior Publication Data
US 2006/0104130 A1      May 18, 2006

(30) Foreign Application Priority Data
Nov. 15, 2004    (KR)    ............ 10-2004-0092882

(51) Int. Cl.
*G11C 16/06*    (2006.01)
*G11C 16/04*    (2006.01)

(52) U.S. Cl. .................. 365/185.23; 365/185.19; 365/185.25; 365/185.28

(58) Field of Classification Search ............ 365/185.23, 365/189.11, 230.06, 185.25, 185.28, 185.19
See application file for complete search history.

(56) References Cited

U.S. PATENT DOCUMENTS

| | | | |
|---|---|---|---|
| 6,233,177 B1 * | 5/2001 | Shokouhi et al. ...... | 365/185.23 |
| 7,064,986 B2 * | 6/2006 | Lee et al. ............... | 365/185.28 |
| 2001/0003511 A1 * | 6/2001 | Taura et al. ........... | 365/185.23 |
| 2001/0021128 A1 * | 9/2001 | Kim ....................... | 365/185.23 |

FOREIGN PATENT DOCUMENTS

| | | |
|---|---|---|
| KR | 1997-0051096 | 7/1997 |
| KR | 1998-021578 | 6/1998 |
| KR | 0170279 | 10/1998 |
| KR | 10-2004-0002132 | 1/2004 |

OTHER PUBLICATIONS

English language abstract of Korean Publication No. 0170279.
English language abstract of Korean Publication No. 1998-021578.
English language abstract of Korean Publication No. 1997-0051096.
English language abstract of Korean Publication No. 10-2004-0002132.

* cited by examiner

*Primary Examiner*—Amir Zarabian
*Assistant Examiner*—Ly Duy Pham
(74) *Attorney, Agent, or Firm*—Marger Johnson & McCollom, P.C.

(57) ABSTRACT

A circuit and method for generating a wordline voltage in a nonvolatile semiconductor memory device. The circuit comprises a switching unit to provide an external program voltage as the wordline voltage, together with a wordline voltage pump to generate the wordline voltage by pumping a power source voltage. After the wordline voltage is raised to a first level by the external program voltage, it is further increased by a pumping operation. According the circuit and method described herein, shortens the time required to reach a target voltage.

15 Claims, 5 Drawing Sheets

CIRCUIT AND METHOD FOR GENERATING WORDLINE VOLTAGE IN NONVOLATILE SEMICONDUCTOR MEMORY DEVICE

CROSS-REFERENCE TO RELATED APPLICATIONS

Priority is hereby claimed under 35 U.S.C. § 119 to Korean Patent Application No. 2004-0092882 filed on Nov. 15, 2004. The entire content of Korean Patent Application No. 2004-0092882 is hereby incorporated herein by reference.

FIELD OF THE INVENTION

The present invention relates to nonvolatile semiconductor memory devices and more particularly to circuitry and methods for generating a wordline voltage in such devices.

BACKGROUND OF THE INVENTION

In prior art nonvolatile semiconductor memory devices, a wordline voltage is applied to a wordline of a selected memory cell in order to program the selected cell. The wordline voltage has a voltage level higher than the circuit's external voltage. An internal wordline voltage generator circuit is used to generate the wordline voltage from an external voltage source.

FIG. 1 is a schematic diagram illustrating a conventional wordline voltage generator for a nonvolatile semiconductor memory device. The wordline voltage generator typically includes a wordline voltage pump 20 activated in response to a pumping enable signal VPPEN. The pumping enable signal VPPEN is generated by a pumping enable signal generator 30 which is activated by a program command signal PCOMM for a selected memory cell. The wordline voltage pump 20 raises the wordline voltage VPI to a target voltage by stepping up a power source voltage VCC. Conventionally, the power source voltage VCC is about 1.8 V and the target voltage of the wordline voltage VPI can be up to about 10 V.

A conventional wordline voltage generator is designed to raise the wordline voltage VPI by a pumping operation through the wordline voltage pump 20. As a result, in a conventional wordline voltage generator a considerable amount of time is required to reach the target voltage VPI after activation of the pumping enable signal VPPEN. In modes requiring a high speed programming operation, the time required to reach the target voltage of the wordline voltage VPI may causes a problem by degrading the overall operating speed of the device.

SUMMARY OF THE INVENTION

The present invention is directed to a wordline voltage generator circuit which reaches a target voltage in a short time. The present invention is also directed to a method of reaching a target voltage in a short time.

The wordline voltage generator of the present invention includes a wordline voltage pump which generates the wordline voltage by pumping up the power source voltage, and a switching unit which provides an external program voltage for use as the wordline voltage. During the operation of the circuit the wordline voltage is first increased by the external program voltage, and then the wordline voltage is further increased by pumping up the power source voltage. The present invention improves the time required to reach the target voltage.

Another aspect of the invention is a method of generating a wordline voltage in a nonvolatile semiconductor memory device. The method comprises: a first step of raising the wordline voltage to a predetermined level by using an external program voltage; and a second step of raising the wordline voltage further by pumping the power source voltage when the wordline voltage enters a predetermined range. The external program voltage is higher than the power source voltage.

BRIEF DESCRIPTION OF THE DRAWINGS

The accompanying drawings are included to provide a further understanding of the invention, and are incorporated in and constitute a part of this specification. The drawings illustrate examples of embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the invention to those skilled in the art. Like numerals refer to like elements throughout the specification.

Hereinafter, an exemplary embodiment of the present invention will be described in conjunction with the accompanying drawings.

Figure 1:
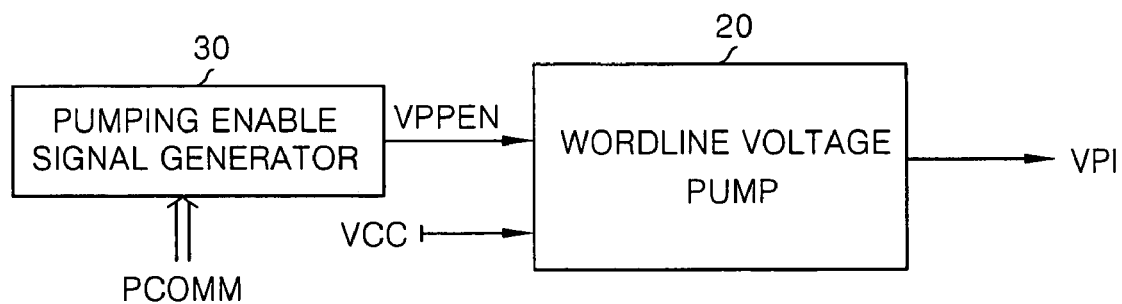
FIG. 1 is a schematic diagram illustrating a prior art circuit for controlling a wordline voltage generator in a nonvolatile semiconductor memory device.
Figure 2:
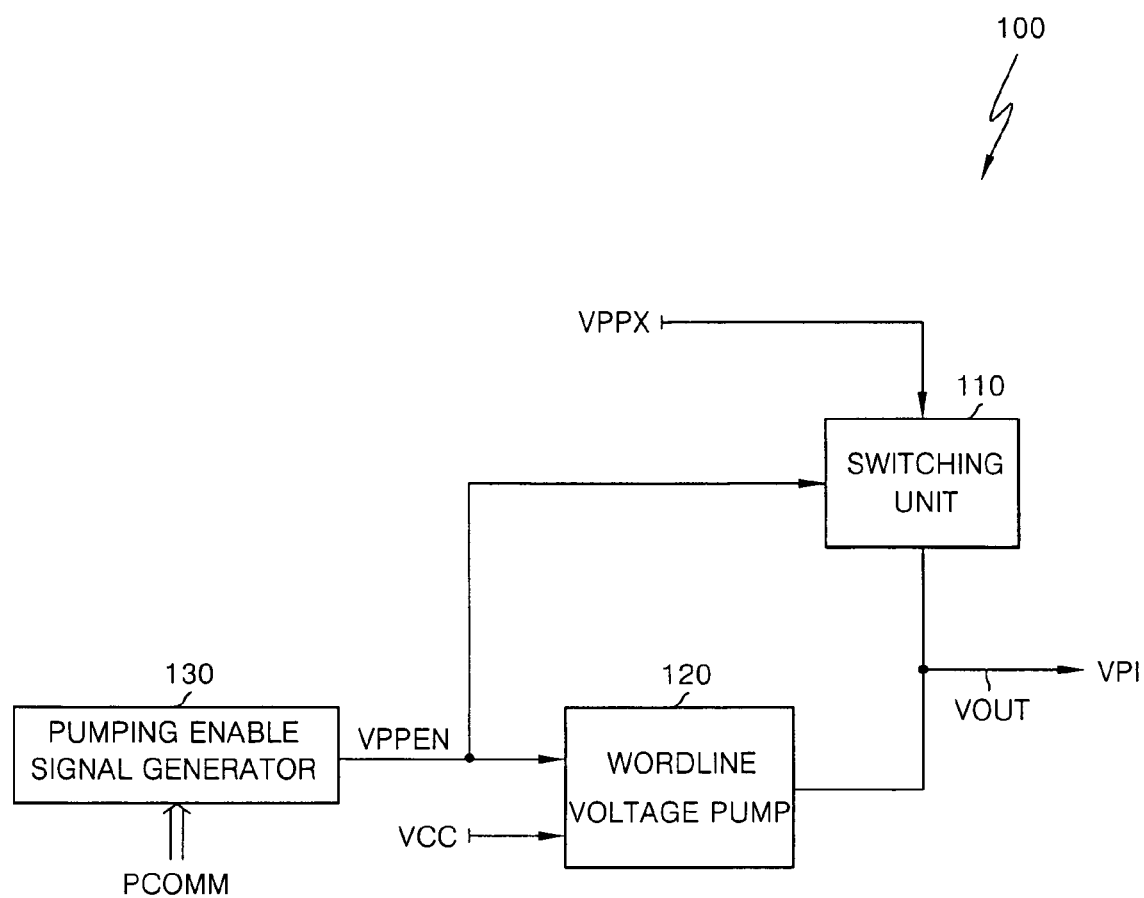
FIG. 2 is a functional block diagram illustrating a control feature for a wordline voltage generator in a nonvolatile semiconductor memory device, according to an embodiment of the present invention.
Figure 3:
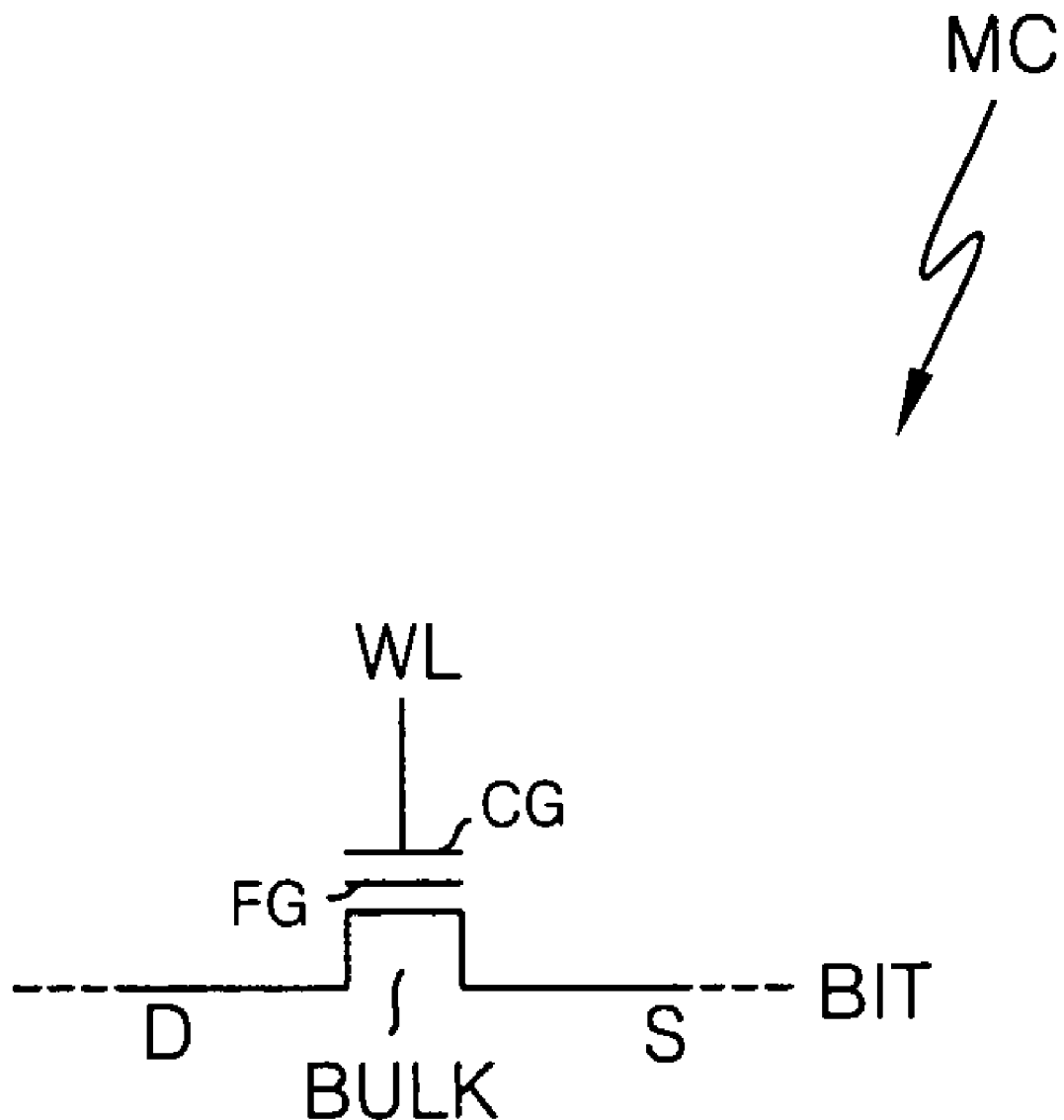
FIG. 3 is a circuit diagram illustrating a memory cell embedded in a nonvolatile semiconductor memory device employing the wordline voltage generator of the present invention.

FIG. 2 is a functional block diagram illustrating a word line voltage generator 100 for a first embodiment of the present invention. Circuit 100 is designed for use in a nonvolatile semiconductor memory device. FIG. 3 shows a memory cell MC for a nonvolatile semiconductor memory device. The cell MC can receive voltage signals from the wordline voltage generator 100.

Referring to FIG. 3, the memory cell MC includes a source electrode S, a drain electrode D, a floating gate FG, and a control gate CG. The memory cell MC is electrically programmable and erasable. A wordline WL is coupled to the control gate CG of the memory cell MC. The source electrode S or the drain electrode D is connected to a bitline BIT to input and output data. The method of programming and erasing a memory cell, such as memory cell MC are conventional and well known.

Returning to FIG. 2, the wordline voltage generator 100 pumps up a power source voltage VCC in order to provide the wordline voltage VPI. The wordline voltage generator 100 includes a voltage output terminal VOUT, a switching unit 110, and a wordline voltage pump 120. The voltage output terminal VOUT is connected to the wordline WL of the memory cell MC shown in FIG. 3.

The switching unit 110 transfers an external program voltage VPPX to the voltage output terminal VOUT in response to the pumping enable signal VPPEN. The pumping enable signal is supplied from a pumping enable signal generator 130, which is activated in response to the program command PCOMM. The program command PCOMM causes execution of a programming operation for a selected memory cell. The external program voltage VPPX is applied from an external source when the nonvolatile semiconductor memory device is put into an acceleration mode. The external program voltage VPPX is about 8.5 V.

The program voltage PCOMM is generated after the nonvolatile memory device enters into the acceleration mode. Switching unit 110 operates when the memory is operating in accelerated mode. When the memory device is not in an acceleration mode, the memory operates in a conventional manner.

Figure 4:
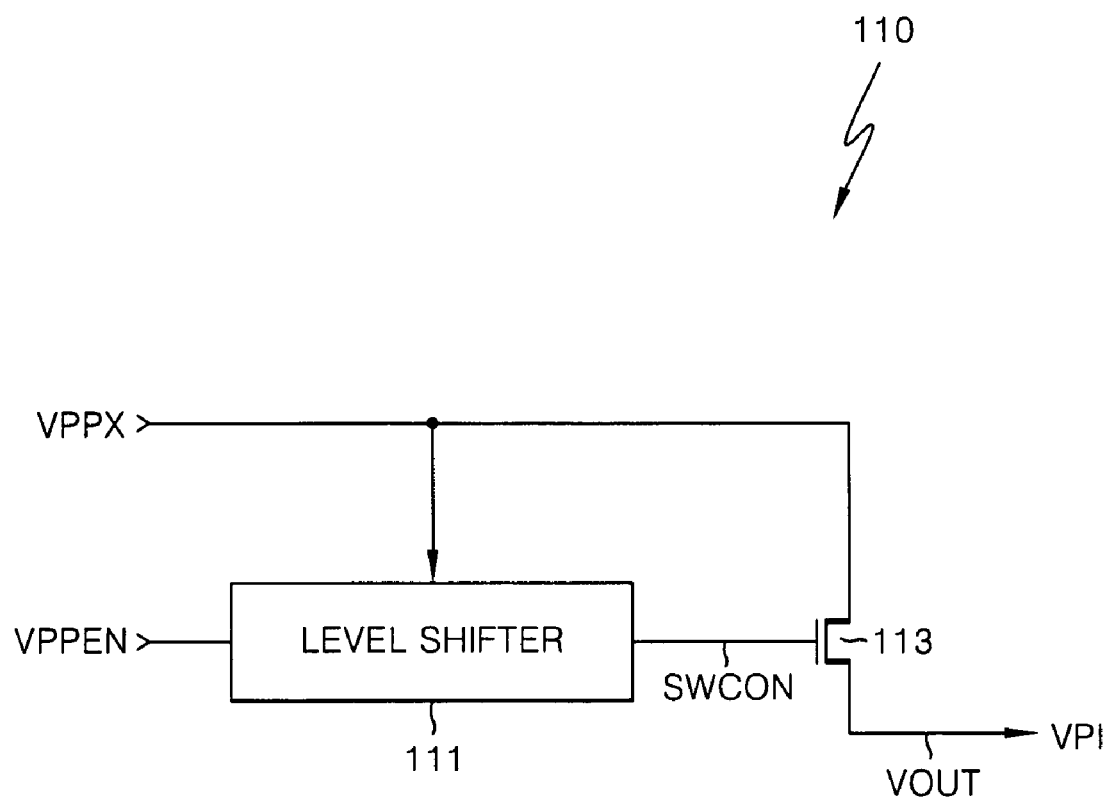
FIG. 4 is a circuit diagram illustrating a switching unit shown in FIG. 2.

FIG. 4 is a circuit diagram illustrating the switching unit 110 shown in FIG. 2. Referring to FIG. 4, the switching unit 110 includes a level shifter 111 and a switching transistor 113. The level shifter 111 generates a switching control signal SWCON in response to the pumping enable signal VPPEN. The switching transistor is controlled by the switching control signal SWCON. As a result, the switching transistor 113 is turned on in response to activation of the pumping enable signal VPPEN, the external program voltage VPPX is transferred to the voltage output terminal VOUT. In this embodiment, the level of the wordline voltage VPI, is increases by the operation of the switching transistor 113, and its value is Vpp−Vt. Vpp is a voltage level of the external program voltage VPPX and Vt is a threshold voltage of the switching transistor 113.

Returning to FIG. 2, the pump enable signal generator 130 activates the pumping enable signal VPPEN in response to the program command PCOMM. The wordline voltage pump 120, as in a conventional circuit, raises the wordline voltage VPI to the target voltage by pumping the power source voltage VCC that is supplied from an external source. Here, the power source voltage VCC is about 1.8V as an example, which is lower than the external program voltage VPPX.

Figure 5:
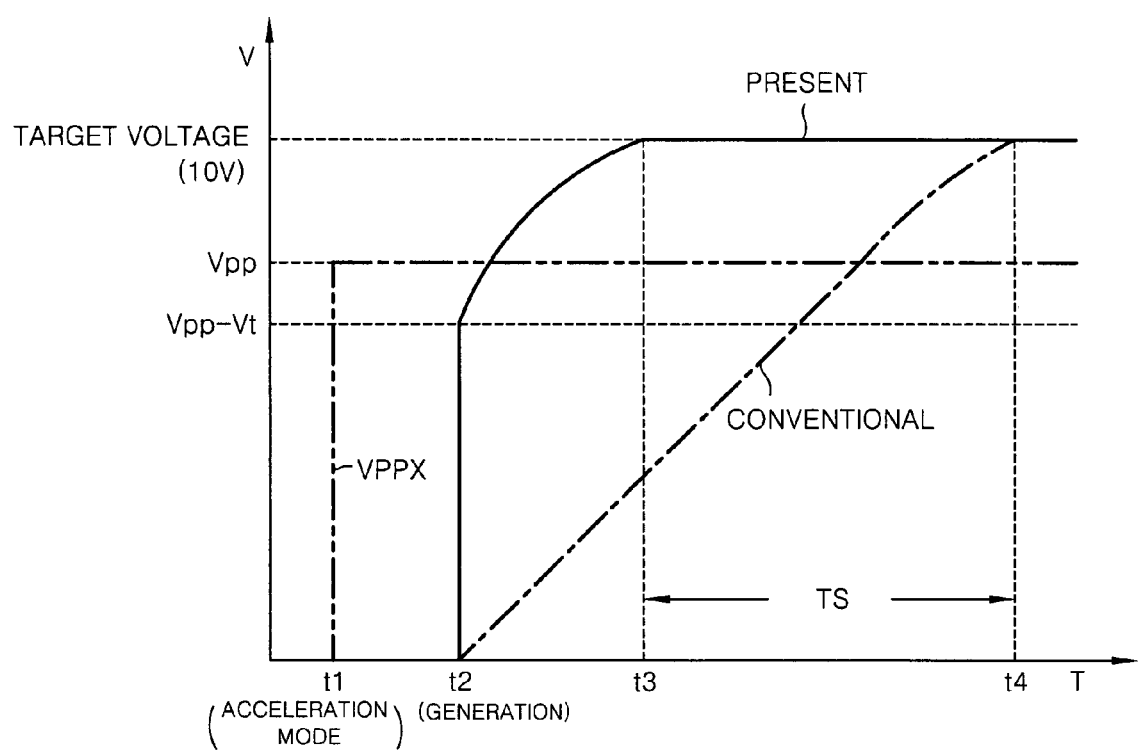
FIG. 5 is a graphic diagram comparatively showing the variations of wordline voltages by the convention and the present invention.

FIG. 5 is a graphic diagram comparatively showing the variations of wordline voltages by the convention circuitry and by the present invention. Referring to FIG. 5, when the nonvolatile semiconductor memory device enters into the acceleration mode, at t1, the external program voltage VPPX is applied thereto. At the time when the program command PCOMM is generated, at t2, the wordline voltage VPI rises up to a predetermined level (i.e., Vpp−Vt in this embodiment) due to the external program voltage VPPX.

After the wordline voltage VPI reaches a predetermined range, the voltage level of the wordline voltage VPI is dependent on an operation of the wordline voltage pump 120 that pumps up the power source voltage VCC. In other words, after the wordline voltage VPI reaches a predetermined range, the wordline voltage pump 120 raises the level of the wordline voltage VPI by pumping up the power source voltage VCC.

Thus, according to the present invention, after a first step wherein the wordline voltage VPI is increased by the external program voltage VPPX, the wordline voltage VPI further increases by the pumping operation with the power source voltage VCC. Therefore, the present invention improves the time required to reach the target voltage (TS=t4−t3). On the other hand in the conventional case the wordline voltage increases only by means of a pumping operation of the source voltage VCC, and it follows the line marked "conventional" in FIG. 4.

As described above, the wordline voltage generator of the invention includes a wordline voltage pump which generates the wordline voltage by pumping up the power source voltage, and a switching unit which provides an external program voltage which is used as the wordline voltage. With the present invention, after the wordline voltage is first increased by the external program voltage, the wordline voltage is further increased by the pumping operation with the power source voltage. Therefore, the present invention improves the time required to reach the target voltage in contrast to a conventional circuit where the wordline voltage increases only by means of a pumping operation of the power source voltage VCC.

Although the present invention has been described in connection with the embodiments of the present invention illustrated in the accompanying drawings, it is not limited thereto. It will be apparent to those skilled in the art that various substitution, modifications and changes may be thereto without departing from the scope and spirit of the invention.

What is claimed is:

1. A circuit for generating a wordline voltage in a nonvolatile semiconductor memory device that includes a memory cell that is electrically programmable and erasable and that is gated by a voltage on a wordline, the circuit being responsive to a pumping enable signal and receiving an external program voltage and a power source voltage, the power source voltage being lower than the external program voltage and the wordline voltage being higher than the external program voltage, the circuit comprising:

a voltage output terminal for providing the wordline voltage to the wordline;

a switching unit for transferring the external program voltage to the voltage output terminal in response to the pump enable signal; and a wordline voltage pump for providing the wordline voltage to the voltage output terminal by pumping up the power source voltage in response to the pump enable signal.

2. The circuit as set forth in claim 1, wherein the pumping enable signal is activated in response to generation of a program command that instructs execution of a programming operation for the memory cell.

3. The circuit as set forth in claim 2, wherein the external program voltage is provided to the switching unit from an external source at a time when the device enters a predetermined acceleration mode, the time being earlier than a time of generation of the program command.

4. The circuit as set forth in claim 1, wherein the switching unit comprises:

a level shifter for generating a switching control signal for changing to the external program voltage; and a switching transistor for transferring the external program voltage to the voltage output terminal, being controlled by the switching control signal, in response to activation of the pumping enable signal.

5. A method of generating a wordline voltage in a nonvolatile semiconductor memory device, the wordline voltage being provided to a wordline to gate a memory cell, the circuit receiving an external program voltage and a power source voltage, the wordline voltage being higher than the external program voltage and the power source voltage, the method comprising:
- a first step of raising the wordline voltage up to a predetermined level by using the external program voltage; and
- a second step of further raising the wordline voltage by pumping the power source voltage when the wordline voltage enters a predetermined range, the external program voltage being higher than the power source voltage.

6. The method as set forth in claim 5, wherein the first and second steps are carried out in response to a predetermined pumping enable signal that is generated in response to generation of a program command that instructs a programming operation for the memory cell.

7. The method as set forth in claim 5, wherein the external program voltage is supplied from an external source at the time of a predetermined accelerating mode that begins earlier than the time the program voltage is generated.

8. A circuit for generating a wordline voltage in a nonvolatile semiconductor memory device that includes a memory cell that is electrically programmable and erasable and is gated by a predetermined wordline,
- the circuit being responsive to a pumping enable signal and receiving an external program voltage and a power source voltage, the power source voltage being lower than the external program voltage and the wordline voltage being higher than the external program voltage, the circuit comprising:
- means for transferring the external program voltage to the wordline in response to the pump enable signal; and
- means for pumping the power source voltage and for providing the pumped voltage to the wordline voltage in response to the pump enable signal.

9. The circuit as set forth in claim 8, wherein the pumping enable signal is activated in response to generation of a program command that instructs execution of a programming operation for the memory cell.

10. The circuit as set forth in claim 9, wherein the external program voltage is provided at a time when the device enters a predetermined acceleration mode, the time being earlier than a time of generation of the program command.

11. The circuit as set forth in claim 8, wherein the means for transferring comprises:
- level shifter means for generating a switching control signal for changing to the external program voltage; and
- means for transferring the external program voltage to the voltage output terminal, being controlled by the switching control signal, in response to activation of the pumping enable signal.

12. A circuit for generating a wordline voltage in a nonvolatile semiconductor memory device when the device is in an acceleration mode, the circuit having a wordline, the circuit receiving an external program voltage and a power source voltage, the circuit operating in first and second time periods, the circuit comprising:
- a switching unit to provide the external program voltage as the wordline voltage in the first time period, and
- a voltage pump to provide voltage to the wordline voltage by pumping the power source voltage in the second time period,
- whereby after the wordline voltage rises up to a first level in the first time period due to the external program voltage, the wordline voltage further increases during the second time period due to the voltage provided by the voltage pump.

13. The circuit set forth in claim 12, wherein the first and second time periods occur in response to a pumping enable signal that is generated in response to generation of a program command that initiates a programming operation in the memory cell.

14. The circuit as set forth in claim 12, wherein the external program voltage is provided during the first time period when the device enters a predetermined acceleration mode.

15. The circuit as set forth in claim 12, wherein the switching unit includes:
- level shifter means for generating a switching control signal for changing the wordline voltage to the external program voltage.

* * * * *